Jan. 14, 1969 N. C. TOMBS 3,422,321

OXYGENATED SILICON NITRIDE SEMICONDUCTOR DEVICES
AND SILANE METHOD FOR MAKING SAME
Filed June 20, 1966

INVENTOR.
NIGEL C. TOMBS
BY
Robert J. Haase
ATTORNEY

United States Patent Office 3,422,321

Patented Jan. 14, 1969

3,422,321

OXYGENATED SILICON NITRIDE SEMICONDUCTOR DEVICES AND SILANE METHOD FOR MAKING SAME

Nigel C. Tombs, Stow, Mass., assignor to Sperry Rand Corporation, a corporation of Delaware Filed June 20, 1966, Ser. No. 558,803

U.S. Cl. 317—235 15 Claims

Int. Cl. H01l *11/00;* H01l *3/00;* H01l *7/00*

ABSTRACT OF THE DISCLOSURE

A low temperature pyrolysis method utilizing silane, ammonia and nitrous oxide to deposit oxygenated silicon nitride on a semiconductor device. In one example, the oxygenated silicon nitride forms the gate insulating layer of an insulated gate field effect transistor.

Figure 1:
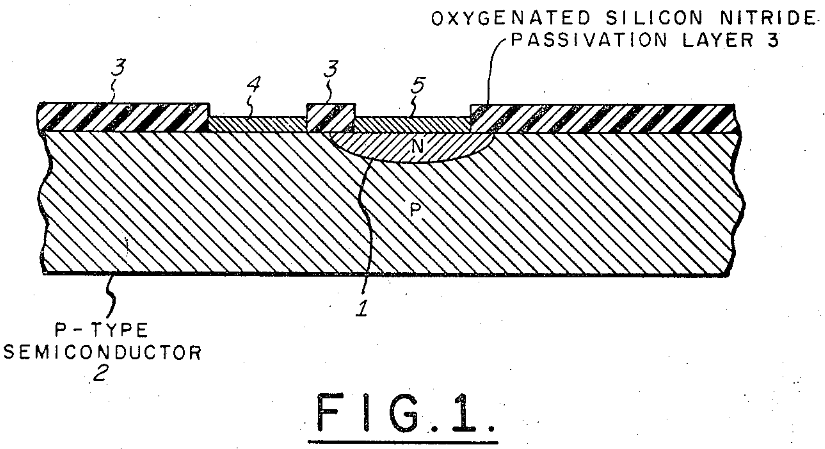

The present invention concerns a low temperature method for producing oxygenated silicon nitride layers on substrate materials, especially semiconductor substrate materials, and to semiconductor devices embodying oxygenated silicon nitride layers.

In the current state of the art relating to silicon integrated circuits, thermally-grown layers of silicon oxide play a central role. Said oxide serves as a diffusion mask, as a passivating layer over p-n junctions that extend to exposed surfaces, and as the insulating dielectric in MOS (metal-oxide-semiconductor) transistors and diodes. The oxide technology has achieved a great advance in simplicity, reliability and cost relative to the earlier methods. At the present time, however, with the demand increasing for more complex integrated circuits characterized by higher reliability, smaller size and low cost, the limitations of the oxide technology, including the oxide method and the semiconductor devices formed thereby are beginning to be felt.

There are several areas in which silicon oxide layers and existing methods for its preparation are less than adequate. In order to obtain appreciable oxide formation, reaction temperatures in excess of 1000° C. must be maintained for periods of several hours. During such high temperature processing, the dopants within the silicon upon which the oxide layer is to be formed diffuse through the silicon and alter the profile of p-n junctions that are produced prior to the oxidation step. In general, oxide layers are a fraction of a micron in thickness. The nature of the oxide formation process requires that the oxygen diffuse through the oxide being formed in order to continue to react with the underlying silicon. After the oxide layer has thickened to a few microns, penetration of the oxygen through the oxide layer substantially ceases for reasonable values of oxidation time and reaction temperature. The relatively thin oxide layers obtainable do not provide adequate isolation of underlying silicon devices from metallic layers and other materials which subsequently are deposited on top of the oxide layer or from the long-term degrading effects of ambient atmosphere on the silicon devices being protected. The ability of the oxide layer to function reliably as a diffusion mask also is seriously handicapped by the inherent thickness limitation. In addition to the foregoing difficulties attending the formation of useful thicknesses of oxidized silicon layers, the oxidized silicon layer itself exhibits relatively poor electrical stability. It has been found, for example, that undesirable changes in the operating characteristics of oxide-protected semiconductor devices results from protracted application of electrical bias, by the drift of ionic charge carriers in the oxide layer, or by chemical reaction.

Copending patent application Ser. No. 505,380 for "Silicon Nitride Semiconductor Devices and Silane Method For Making Same," filed Oct. 27, 1965 in the name of the present inventor and assigned to the present assignee, discloses a technique for forming silicon nitride layers especially on semiconductor substrate materials for use as diffusion masks, passivating layers over p-n junctions and as insulating dielectrics avoiding the above-mentioned limitations associated with the oxide technology. More particularly, said technique includes a method for the formation of silicon nitride at low reaction temperatures which are non-injurious to semiconductor devices and the junctions previously formed therein. The method further provides for the deposition of silicon nitride in controllable amounts up to mils in thickness and yields protectively coated semiconductor devices characterized by improved stability especially relating to resistance to change in operating characteristics brought about by protracted application of electrical bias, by the drift of ionic charge carriers in the silicon nitride layer or by chemical reaction.

Although the silicon nitride technology disclosed in the aforementioned patent application constitute a significant improvement over the prior art silicon oxide technique, there is one aspect which to some extent detracts from its over-all merit. Silicon nitride is highly inert. This is both an asset from the viewpoint of stability and a handicap from the viewpoint of capability of being etched. In the planar fabrication method of producing semiconductor devices, the diffusion masking material is deposited on the semiconductor substrate and then etched away in selected areas prior to the diffusion of the dopants to produce the desired p-n junctions. The accuracy with which the p-n junctions are formed and located by the diffusion depends upon the precision with which the selected areas can be etched. In general, diffusion masking materials which are difficult to etch do not produce the most accurately located p-n junctions. The following typical instance will exemplify the problem. In accordance with conventional practice, etching of the diffusion masking material is accomplished with the aid of a photo-resist which is selectively placed on the material leaving holes in those areas of the photo-resist where the underlying material is to be removed by etching. There is some tendency for the photo-resist to become separated from the underlying material during protracted etching periods. As the photo-resist material lifts away, the etching solution penetrates between the photo-resist and the material being etched, with the result that the hole which is etched in the material is substantially widened at the top (photo-resist interface) relative to the bottom (semiconducor interface). The tapered walls surrounding the etched hole make difficult the accurate location of diffused junctions because of the uncertainty of the exact location of a sufficiently thick perimeter of material to act as an effective diffusion mask. A fast etching rate, on the other hand, results in vertical walls surrounding the holes etched in the diffusion masking material and facilitates the precise location of the p-n junction profiles.

It is an object of the present invention to provide a low temperature method for forming a coating on semiconductor and other substrates, said coating having a stability and etching rate favorably comparable to those of silicon nitride.

Another object is to provide a method for forming a coating on semiconductor materials, said coating having characteristics favoring use as a diffusion mask, as a passivating layer over p-n junctions and as a dielectric.

A further object is to provide semiconductor devices characterized by improved stability and a coating which may be etched more readily than silicon nitride.

These and other objects of the present invention, as will appear from a reading of the following specification are achieved in the disclosed method embodiment by the reaction of silane ($SiH_4$), ammonia ($NH_3$), and nitrous oxide ($N_2O$) in a reaction chamber at a temperature in the range from about 600° C. to about 1000° C. It is believed that the silane decomposes to yield atomic silicon, the ammonia decomposes to yield atomic nitrogen and the nitrous oxide decomposes to yield atomic oxygen, which recombine and deposit on a substrate surface within the reaction chamber to yield a layer of oxygenated silicon nitride. The proportions of the constituents of silicon, nitrogen and oxygen in the deposited layer are controlled by adjusting the flow rates of silane, ammonia, nitrous oxide gas mixtures relative to each other. The silane mixture comprises 1% silane by volume in argon; the ammonia mixture comprises 1% ammonia by volume in argon, and the nitrous oxide comprises 1% nitrous oxide by volume in argon. The ratio of the flow rate of the nitrous oxide to the flow rate of the ammonia is in the range from 0 to about .9. In the disclosed method embodiment, the flow rate of the combined nitrous oxide and ammonia mixtures is 52 milliliters per minute, the flow rate of the silane mixture is 6.5 milliliters per minute and the substrate is silicon heated to 900° C.

In accordance with the device embodiments of the present invention, improved stability and operating characteristics are achieved by the provision of p-n junction semiconductor devices and metal-insulating-semiconductor (MIS) diodes embodying oxygenated silicon nitride as a passivating layer and as the insulation material respectively.

Figure 2:
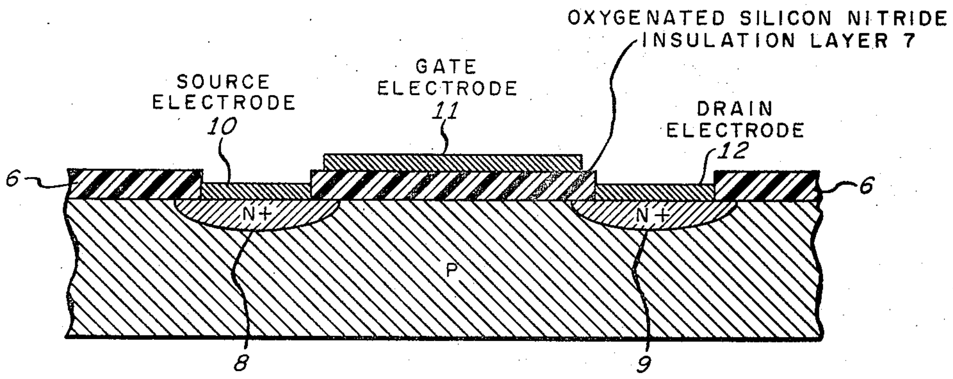

For a more complete understanding of the present invention, reference should be had to the following specification and to the drawings of which:

FIGURE 1 is a cross-sectional view of a planar diode species of the present invention; and FIGURE 2 is a cross-sectional view of a metal-insulating-semiconductor species of the invention.

Referring now to a typical example of the method species of the present invention, the reaction of silane, ammonia and nitrous oxide is carried out in a vertical reactor quartz tube of about 1" diameter in which a substrate is located 1" below the gas inlet port at the top of the tube. The substrate may consist of single-crystal silicon having a polished surface prepared by mechanical polishing. The surface of the substrate within the reactor is heated dielectrically to about 900° C. for about ten minutes at atmospheric pressure in the presence of 1% ammonia by volume in argon flowing at the rate of 52 milliliters per minute. Then, the $NH_3$ supply is shut off and replaced by the appropriate mixture of 1% ammonia in argon and 1% nitrous oxide in argon flowing at the total rate of 52 milliliters per minute for about five minutes. For the next ten minutes, silane is added at a rate of 6.5 milliliters per minute. Then, the silane is cut off and the substrate is allowed to cool to room temperature in the ammonia-nitrous oxide-argon atmosphere. The function of the argon simply is to transport the silane, ammonia and nitrous oxide gases through the reactor tube. The 1% nitrous oxide in argon and the 1% ammonia in argon are mixed so that the ratio of the flow rate of the nitrous oxide to the flow rate of the ammonia is a value within the range from 0 to about .9. Any value within said range produces a deposited layer of oxygenated silicon nitride characterized by a stability and etching rate favorably comparable to those of silicon nitride. The thickness of the oxygenated silicon nitride coating on the substrate resulting from the use of a flow rate ratio $N_2O/NH_3=.25$, the aforementioned reactor tube geometry, reaction temperature and gas flow rates was found to be about ½ micron which is suitable for diffusion masking and p-n junction passivation purposes.

An important feature of the method species of the present invention is that the silane-ammonia-nitrous oxide reaction yields innocuous byproducts. This is in contrast to some prior art processes which produce acids as byproducts. Such processes, of course, are incompatible with the formation of deposited layers on metals or semiconductors inasmuch as the acid byproducts attack the substrate upon which the layer is to be formed.

It is believed that the chemical reaction of the present invention takes place at relatively low temperature because the silane, ammonia and nitrous oxide starting materials decompose to yield atomic silicon, atomic nitrogen and atomic oxygen, which in turn readily combine to form oxygenated silicon nitride. Commercially available silicon, nitrogen and oxygen as opposed to the same elements obtained via the decompositions of the aforementioned respective compounds, require reaction temperatures considerably in excess of 1000° C. which are injurious to preexisting p-n junction profiles in semiconductor substrates.

Oxygenated silicon nitride is deposited on a silicon wafer as an adherent smooth coating very similar in appearance to that of pure silicon nitride layers. Silicon nitride layers, when examined by reflection electron diffraction, produce patterns which are rather diffuse, suggesting that the layers are largely amorphous. Experiments have indicated that the composition of oxygenated silicon nitride can be continuously varied from pure silicon nitride to silicon dioxide. At the low oxygen end of the range of compositions, both electron diffraction and infrared spectroscopy indicate material that is structurally related to pure silicon nitride. Correspondingly, at the high oxygen end of the range of compositions, both techniques indicate material which is structurally related to silicon dioxide.

Hydrofluoric acid is a solvent (etchant) for the thicknesses of oxygenated silicon nitride layers produced by the present invention, i.e., thicknesses in the range from microns to mils. Dilute hydrofluoric acid permits the silicon nitride layer to be removed controllably in a manner analogous to the way in which silicon dioxide layers are thinned in the present state of the art. Controlled-area etching of the oxygenated silicon nitride layers can be accomplished by using wax as a mask against the acid etching. Conventional photo-resist masking also is applicable as in the case with silicon dioxide etching procedures.

The foregoing silane method for the deposition of oxygenated silicon nitride layers on semiconductor substrates not only simplifies and facilitates the fabrication of the desired semiconductor devices, but also imparts superior operating characteristics thereto. One of the basic problems associated with oxide-protected silicon devices is the electrostatic interaction of the oxide layers with the silicon and, in particular, the changes in the interaction attributable to changes in the charge distribution inside the oxide layer. Said changes, which are relatively slow, can be produced by the protracted application of an electrical bias, by diffusion of impurities, or by chemical reaction. For example, it has been found that the operating point of the gate of a metal-oxide-semiconductor (MOS) transistor can be displaced by more than 10 volts merely by subjecting the transistor to an applied bias for a few hours at about 100° centigrade. Such displacement results from the drifting of ions through the oxide layer under the influence of the applied field. The changes are accelerated by the environmental temperature.

Of particular importance in the present invention is the fact that the drifting of ions through an oxygenated silicon nitride layer is orders of magnitude lower than the drifting of ions through a silicon dioxide layer. This was observed by a comparison of data obtained from metal-silicon dioxide-silicon capacitors and metal-oxygenated silicon nitride-silicon capacitors each of which was contaminated with sodium ions and subjected to a bias of +30 volts for two hours at 150° centigrade. Whereas shifts of about 20 volts were found in the capacitance versus voltage characteristic of the former capacitors, said characteristic of the latter capacitors was substantially unchanged. The oxygenated silicon nitride capacitors which provided the above data comprised material deposited in accordance with the present invention using different ratios of flow rate of nitrogen oxide to the flow rate of ammonia within the range from 0 to 9. Thas is, the oxygenated silicon nitride material (constituting the dielectric of the tested capacitors) represented a wide range of compositions from pure silicon nitride toward silicon dioxide. The unusual property of the entire range of compositions of the oxygenated silicon nitride tested is that the material retains the desirable ion migration imperviousness of silicon nitride even with compositions bearing a strong structural resemblance to silicon dioxide. Moreover, the etching rate of oxygenated silicon nitride has been found to approach the desirable high etching rate of silicon dioxide even with compositions bearing a strong structural resemblance to silicon nitride.

The cross-sectional view of FIGURE 1 represents a planar diode utilizing oxygenated silicon nitride coating for junction passivation. The p-n junction 1 is protected by oxygenated silicon nitride layer 3 where the junction edges rise to the surface of the semiconductor 2. In a typical case, the junction 1 is produced by phosphorous diffusion into one ohm-centimeter p-type silicon. The oxygenated silicon nitride passivation layer serves as a diffusion mask and also protects the edges of junction 1 after the junction has been produced by diffusion. Diodes biasing potentials are applied via electrodes 4 and 5. The present invention, of course, is applicable to p-on-n as well as the n-on-p diode of FIGURE 1.

FIGURE 2 represents a planar silicon N-channel insulated-gate field-effect transistor using oxygenated silicon nitride as the junction passivating layer 6 and also as the gate insulating layer 7. In addition, oxygenated silicon layers 6 and 7 serve as a diffusion mask during the formation of source junction 8 and drain junction 9. Operating potentials are applied via source electrode 10, gate electrode 11 and drain electrode 12. The use of oxygenated silicon nitride in lieu of silicon dioxide for layers 6 and 7 results in improvement of the stability of the field-effect transistor. Such improvement has been observed in tests made on many insulated-gate field-effect transistors utilizing oxygenated silicon nitride as the junction passivating and insulating layers. In the devices tested, the composition of the oxygenated silicon nitride layers was that resulting from a ratio of .25 of the flow rate of nitrous oxide to the flow rate of the ammonia using the method of the present invention. The transistors were heated for twenty-four hours at 300° centigrade in a nitrogen atmosphere and tested before and after the heat treatment as to drain-source breakdown voltage and gate threshold voltage. The small changes in the observed voltage values caused by the extended period of heat treatment indicate a high order of stability superior to that of comparable devices utilizing silicon dioxide.

From the preceding, it can be seen that passivated p-n junctions of superior quality can be obtained through the oxygenated silicon nitride technique of the present invention and that oxygenated silicon nitride is highly impervious to the drift of ionic species which are mobile in a silicon dioxide layer. The combination of the aforementioned two desirable factors together with the relatively high etching rate of oxygenated silicon nitride facilitates the attainment of stable, insulated-gate field-effect transistors and other semiconductor devices having precisely delineated junction profiles.

While the invention has been described in its preferred embodiments, it is to be understood that the words which have been used are words of description rather than limitation and that changes within the purview of the appended claims may be made without departing from the true scope and spirit of the invention in its broader aspects.

What is claimed is:

1. The method of depositing oxygenated silicon nitride on a device comprising a semiconductor substrate comprising the steps of
placing said substrate in a reactor chamber,
heating said substrate to a temperature in the range from about 600° C. to about 1000° C., and
simultaneously passing silane, a gaseous compound containing nitrogen and a gaseous compound containing oxygen over said substrate.

2. The method defined in claim 1 wherein
said gaseous compound containing nitrogen is ammonia, and
said gaseous compound containing oxygen is nitrous oxide.

3. The method defined in claim 2 wherein the ratio of the flow rate of said nitrous oxide to the flow rate of said ammonia is in the range from 0 to about .9.

4. The method of depositing oxygenated silicon nitride on a device comprising a semiconductor substrate comprising the steps of
placing said substrate in a reactor chamber,
heating said substrate to a temperature in the range from about 600° C. to about 1000° C., and
simultaneously passing a first gaseous mixture of silane and argon, a second gaseous mixture of ammonia and argon, and a third gaseous mixture of nitrous oxide and argon over said substrate.

5. The method defined in claim 4 wherein each of said three gaseous mixtures are 1% by volume in argon,
the total flow rate of said second and third mixtures being 52 milliliters per minute for a 1" diameter reactor chamber, and
the flow rate of said first mixture being 6.5 milliliters per minute for a 1" diameter reactor chamber.

6. The method defined in claim 5 wherein said temperature is about 900° C.

7. The method of depositing oxygenated silicon nitride on a device comprising a semiconductor substrate comprising the steps of
placing said substrate in a reactor chamber,
heating said substrate to a temperature in the range from about 600° C. to about 1000° C. in the presence of a mixture of ammonia and nitrous oxide,
said mixture being characterized by a ratio of the flow rate of nitrous oxide to the flow rate of ammonia in the range from near 0 to about .9 and, while maintaining said heating,
adding silane to said mixture.

8. The method defined in claim 7 and further comprising the steps of
discontinuing the flow of said silane, and
allowing said substrate to cool in the presence of said mixture.

9. A semiconductor substrate
embodying at least one p–n junction whose edge extends to a surface of said semiconductor substrate, and
a layer of oxygenated silicon nitride on said surface and covering said edge of the junction, said layer being the in situ deposited reaction product of a gaseous mixture of silane, a compound containing nitrogen, and a compound containing oxygen applied to the surface of said substrate heated to a temperature of about 600° C. to about 1000° C.

10. The semiconductor device of claim 9 wherein said layer is apertured for the fixing of an electrode on said surface at a location other than where said junction edge extends to said surface.

11. The semiconductor device of claim 9 wherein said layer is apertured for the fixing of electrodes on said surface on opposite sides of said junction at locations other than where said junction edge extends to said surface.

12. The semiconductor device of claim 11 wherein said semiconductor device is a planar diode.

13. The semiconductor device of claim 9 wherein said semiconductor device embodies a pair of p-n junctions whose edges extend to the same surface of said semiconductor device, and said layer of oxygenated silicon nitride covers said edges of said junctions.

14. The semiconductor device of claim 13 wherein said layer is apertured for the fixing of electrodes on said surface at locations other than where said junction edges extend to said surface.

15. The semiconductor device of claim 14 wherein said semiconductor device is a field-effect transistor.

References Cited

UNITED STATES PATENTS

| | | | |
|---|---|---|---|
| 3,165,430 | 1/1965 | Hugle | 317—235 |
| 3,246,214 | 4/1966 | Hugle | 317—235 |
| 3,287,243 | 11/1966 | Ligenza | 317—235 |
| 3,312,879 | 4/1967 | Godejahn | 317—235 |
| 3,373,051 | 3/1968 | Chu et al. | 317—235 |

JAMES D. KALLAM, *Primary Examiner.*

U.S. Cl. X.R.

29—569; 117—106; 317—234